United States Patent
Iucolano et al.

(10) Patent No.: US 10,522,646 B2
(45) Date of Patent: Dec. 31, 2019

(54) HEMT TRANSISTOR OF THE NORMALLY OFF TYPE INCLUDING A TRENCH CONTAINING A GATE REGION AND FORMING AT LEAST ONE STEP, AND CORRESPONDING MANUFACTURING METHOD

(71) Applicant: STMICROELECTRONICS S.R.L., Agrate Brianza (IT)

(72) Inventors: Ferdinando Iucolano, Gravina di Catania (IT); Alfonso Patti, Tremestieri Etneo (IT); Alessandro Chini, Modena (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 151 days.

(21) Appl. No.: 15/159,045

(22) Filed: May 19, 2016

(65) Prior Publication Data
US 2017/0141208 A1 May 18, 2017

(30) Foreign Application Priority Data
Nov. 12, 2015 (IT) .................... 102015000072111

(51) Int. Cl.
*H01L 29/15* (2006.01)
*H01L 29/66* (2006.01)
(Continued)

(52) U.S. Cl.
CPC ...... *H01L 29/66462* (2013.01); *H01L 29/205* (2013.01); *H01L 29/4236* (2013.01);
(Continued)

(58) Field of Classification Search
CPC .......... H01L 29/2003; H01L 29/42376; H01L 29/66431; H01L 29/66462;
(Continued)

(56) References Cited

U.S. PATENT DOCUMENTS 5,021,857 A * 6/1991 Suehiro ............. H01L 21/30621
257/194
6,492,669 B2 * 12/2002 Nakayama ........ H01L 21/28587
257/281
(Continued)

FOREIGN PATENT DOCUMENTS

JP WO 2014/167825 * 10/2014 ........... H01L 21/338

OTHER PUBLICATIONS

Ghaffari et al., "Operational improvement of AlGaN/GaN HEMT on SiC substrate with the amended depletion region", Physica E 74 (2015) pp. 303-309.*
(Continued)

*Primary Examiner* — Jay C Kim
(74) *Attorney, Agent, or Firm* — Seed Intellectual Property Law Group LLP

(57) ABSTRACT

A HEMT transistor of the normally off type, including: a semiconductor heterostructure, which comprises at least one first layer and one second layer, the second layer being set on top of the first layer; a trench, which extends through the second layer and a portion of the first layer; a gate region of conductive material, which extends in the trench; and a dielectric region, which extends in the trench, coats the gate region, and contacts the semiconductor heterostructure. A part of the trench is delimited laterally by a lateral structure that forms at least one first step. The semiconductor heterostructure forms a first edge and a second edge of the first step, the first edge being formed by the first layer.

23 Claims, 6 Drawing Sheets

(51) Int. Cl.
  *H01L 29/423* (2006.01)
  *H01L 29/778* (2006.01)
  *H01L 29/205* (2006.01)
  *H01L 29/20* (2006.01)

(52) U.S. Cl.
  CPC .... *H01L 29/42376* (2013.01); *H01L 29/7786* (2013.01); *H01L 29/7787* (2013.01); *H01L 29/2003* (2013.01)

(58) Field of Classification Search
  CPC ............. H01L 29/66477; H01L 29/778; H01L 29/7787; H01L 29/78
  USPC ......................................................... 257/76
  See application file for complete search history.

(56) References Cited

U.S. PATENT DOCUMENTS

| | | | | |
|---|---|---|---|---|
| 6,849,882 | B2* | 2/2005 | Chavarkar | H01L 29/7783 257/191 |
| 7,470,941 | B2* | 12/2008 | Micovic | H01L 21/28575 257/192 |
| 7,605,017 | B2* | 10/2009 | Hayashi | H01L 29/0623 257/E21.066 |
| 7,800,116 | B2* | 9/2010 | Murata | H01L 29/155 257/76 |
| 7,838,904 | B2* | 11/2010 | Nakazawa | H01L 29/1029 257/194 |
| 7,875,907 | B2* | 1/2011 | Honea | H01L 27/0605 257/192 |
| 7,898,004 | B2* | 3/2011 | Wu | H01L 29/2003 257/183 |
| 7,960,782 | B2* | 6/2011 | Otake | H01L 21/28264 257/330 |
| 7,985,986 | B2* | 7/2011 | Heikman | H01L 29/7787 257/194 |
| 8,072,002 | B2* | 12/2011 | Niyama | H01L 29/0843 257/194 |
| 8,133,776 | B2* | 3/2012 | Matsushita | H01L 29/42316 257/192 |
| 8,198,178 | B2* | 6/2012 | Heikman | H01L 29/402 257/E21.09 |
| 8,278,688 | B2* | 10/2012 | Ohki | H01L 29/2003 257/192 |
| 8,338,861 | B2* | 12/2012 | Briere | H01L 21/28264 257/194 |
| 8,390,000 | B2* | 3/2013 | Chu | H01L 21/28587 257/76 |
| 8,476,125 | B2* | 7/2013 | Khan | H01L 21/02057 257/192 |
| 8,525,227 | B2* | 9/2013 | Jeon | B82Y 10/00 257/192 |
| 8,541,815 | B2* | 9/2013 | Takemae | H01L 29/402 257/192 |
| 8,587,031 | B2 | 11/2013 | Lu et al. | |
| 8,653,559 | B2* | 2/2014 | Corrion | H01L 29/4236 257/192 |
| 8,698,162 | B2* | 4/2014 | Lee | H01L 29/66462 257/192 |
| 8,722,474 | B2* | 5/2014 | Yoon | H01L 29/66462 257/192 |
| 8,742,460 | B2* | 6/2014 | Mishra | H01L 29/0657 257/194 |
| 8,772,842 | B2* | 7/2014 | Dora | H01L 29/2003 257/192 |
| 8,772,901 | B2* | 7/2014 | Zhu | H01L 29/872 257/472 |
| 8,803,246 | B2* | 8/2014 | Wu | H01L 29/2003 257/348 |
| 8,815,665 | B2* | 8/2014 | Lee | H01L 29/2003 257/183 |
| 8,816,395 | B2* | 8/2014 | Bunin | H01L 29/42316 257/194 |
| 8,860,089 | B2* | 10/2014 | Park | H01L 29/778 257/194 |
| 8,901,604 | B2* | 12/2014 | Mishra | H01L 29/0619 257/170 |
| 8,921,894 | B2* | 12/2014 | Ando | H01L 29/2003 257/194 |
| 8,941,118 | B1* | 1/2015 | Chu | H01L 29/2003 257/76 |
| 9,024,357 | B2* | 5/2015 | Puglisi | H01L 29/66462 257/194 |
| 9,087,718 | B2* | 7/2015 | Lal | H01L 27/0883 |
| 9,093,366 | B2* | 7/2015 | Mishra | H01L 29/205 |
| 9,129,888 | B2* | 9/2015 | Lee | H01L 29/2003 |
| 9,166,048 | B2* | 10/2015 | Simin | H01L 29/66446 |
| 9,171,730 | B2* | 10/2015 | Chowdhury | H01L 21/283 |
| 9,257,513 | B1* | 2/2016 | Liu | H01L 21/02304 |
| 9,263,533 | B2* | 2/2016 | Simin | H01L 29/4175 |
| 9,263,567 | B2* | 2/2016 | Takeya | H01L 29/7787 |
| 9,293,573 | B2* | 3/2016 | Akutsu | H01L 29/78 |
| 9,306,049 | B2* | 4/2016 | Lee | H01L 29/42316 |
| 9,443,938 | B2* | 9/2016 | Mishra | H01L 29/2003 |
| 9,508,842 | B2* | 11/2016 | Miyake | H01L 29/7783 |
| 9,525,052 | B2* | 12/2016 | Briere | H01L 29/402 |
| 9,553,152 | B2* | 1/2017 | Ohki | H01L 29/205 |
| 9,559,183 | B2* | 1/2017 | Inoue | H01L 29/7827 |
| 9,590,071 | B2* | 3/2017 | Masumoto | H01L 29/66522 |
| 9,812,532 | B1* | 11/2017 | Chu | H01L 29/2003 |
| 10,043,897 | B2* | 8/2018 | Ozaki | H01L 29/7786 |
| 2002/0017648 | A1* | 2/2002 | Kasahara | H01L 21/28575 257/79 |
| 2009/0039421 | A1* | 2/2009 | Otake | H01L 29/66666 257/329 |
| 2010/0301393 | A1* | 12/2010 | Teraguchi | H01L 29/66462 257/192 |
| 2011/0057257 | A1* | 3/2011 | Park | H01L 29/42376 257/330 |
| 2011/0133205 | A1* | 6/2011 | Nagahisa | H01L 29/4236 257/76 |
| 2013/0056746 | A1* | 3/2013 | Joshin | H01L 29/7781 257/76 |
| 2013/0105812 | A1 | 5/2013 | Ishigaki et al. | |
| 2013/0313612 | A1 | 11/2013 | Khalil et al. | |
| 2014/0051221 | A1 | 2/2014 | Khalil et al. | |
| 2016/0043209 | A1* | 2/2016 | Oyama | H01L 29/1029 257/194 |

OTHER PUBLICATIONS

Orouji et al., "Novel attributes of AlGaN/AlN/GaN/SiC HEMTs with the multiple indented channel", Physica E 74 (2015) pp. 407-413.*

Marcon et al., "200 nm GaN-on-Si epitaxy and e-mode device technology", IEDM15-414 (2015).*

Cai et al., "Control of Threshold Voltage of AlGaN/GaN HEMTs by Fluoride-Based Plasma Treatment: From Depletion Mode to Enhancement Mode," *IEEE Transactions on Electron Devices* 53(9):2207-2215, 2006.

Huang et al., "Evaluation and Application of 600V GaN HEMT in Cascode Structure," *28th Annual IEEE Applied Power Electronics Conference and Exposition*, Long Beach, CA, USA, Mar. 17-21, 2013, pp. 1279-1286.

Iucolano et al., "Influence of properties of $Si_3N_4$ passivation layer on the electrical characteristics of Normally-off AlGaN/GaN HEMT," *1st IEEE Workshop on Wide Bandgap Power Devices and Applications*, Columbus, OH, USA, Oct. 27-29, 2013, pp. 162-165.

Lanford et al., "Recessed-gate enhancement-mode GaN HEMT with high threshold voltage," *Electronics Letters* 41(7):449-450, 2005.

Ohmaki et al., "Enhancement-Mode AlGaN/AlN/GaN High Electron Mobility Transistor with Low On-State Resistance and High Breakdown Voltage," *Japanese Journal of Applied Physics* 45(44):L1168-L1170, 2006. (4 pages).

Saito et al., "Recessed-Gate Structure Approach Toward Normally Off High-Voltage AlGaN/GaN HEMT for Power Electronics Applications," *IEEE Transactions on Electron Devices* 53(2):356-362, 2006.

(56) References Cited

OTHER PUBLICATIONS

Tajima et al., "Effects of Surface Oxidation of AlGaN on DC Characteristics of AlGaN/GaN High-Electron-Mobility Transistors," *Japanese Journal of Applied Physics* 48:020203, 2009. (4 pages).
Uemoto et al., "Gate Injection Transistor (GIT)—a Normally-Off AlGaN/GaN Power Transistor Using Conductivity Modulation," *IEEE Transactions on Electron Devices* 54(12):3393-3399, 2007.
Wang et al., "Off-State Breakdown Characterization in AlGaN/GaN HEMT Using Drain Injection Technique," *IEEE Transactions on Electron Devices* 57(7):1492-1496, 2010.

* cited by examiner

HEMT TRANSISTOR OF THE NORMALLY OFF TYPE INCLUDING A TRENCH CONTAINING A GATE REGION AND FORMING AT LEAST ONE STEP, AND CORRESPONDING MANUFACTURING METHOD

BACKGROUND

Technical Field

The present disclosure relates to a high-electron-mobility transistor (HEMT) of the normally off type including a trench, which comprises a gate region and forms at least one step; further, the present disclosure regards the corresponding manufacturing method.

Description of the Related Art

As is known, HEMT transistors, which are also known as "heterostructure field-effect transistors" (HFETs), are encountering wide diffusion, since they are characterized by the possibility of operating at high frequencies, as well as on account of their high breakdown voltages.

For instance, HEMT transistors are known that include AlGaN/GaN heterostructures, which, however, are devices of a normally on type, i.e., such that, in the absence of voltage on the respective gate terminals, there in any case occurs passage of current; equivalently, these transistors are said to operate in depletion mode. Since it is generally preferable to provide transistors of the normally off type (equivalently, operating in enrichment mode), numerous variants have been proposed, such as for example the transistor described in U.S. Pat. No. 8,587,031.

In detail, U.S. Pat. No. 8,587,031 describes a transistor including a heterostructure of a layer of aluminum gallium nitride (AlGaN) and by a layer of gallium nitride (GaN), arranged in contact with one another. Further, the transistor has a first gate region, which is arranged within a recess that extends in the AlGaN layer and enables modulation of a channel of the normally off type.

Today, there are thus available HEMT transistors operating in enrichment mode. However, these solutions are in any case affected by the so-called phenomenon of drain-induced barrier lowering (DIBL), also known as "early-breakdown phenomenon".

Unlike breakdown, the DIBL phenomenon occurs for low drain-to-source voltages (typically, for voltages comprised between 10 V and 30 V) and entails, in the presence of a zero voltage between gate and source, a sudden increase of the current that circulates between the drain and the source. In greater detail, denoting the voltages present between i) the gate and the source and between ii) the drain and the source as the voltages $V_{gs}$ and $V_{ds}$, respectively, and the current that circulates between the drain and the source when $V_{gs}=0$ as the leakage current, when $V_{ds}<V_{dib1}$ (where $V_{dib1}$ is the voltage at which the DIBL phenomenon occurs) the leakage current density is typically of the order of nanoamps per millimeter. Instead, if $V_{gs}=0$ and $V_{ds}$ exceeds $V_{dib1}$, the leakage current density may even be of the order of the microamps per millimeter. Since the DIBL phenomenon causes premature turning-on of the transistor, there is felt the need to prevent onset of this phenomenon, or in any case reduce the effects thereof.

BRIEF SUMMARY

At least some embodiments of the present disclosure provide a HEMT transistor that will overcome at least in part the drawbacks of the known art.

According to the present disclosure a HEMT transistor includes:

a semiconductor heterostructure including a first semiconductor layer and a second semiconductor layer, the second semiconductor layer being arranged on top of the first layer;

a trench which extends through the second semiconductor layer and a portion of the first semiconductor layer;

a gate region of conductive material, which extends in the trench; and a dielectric region which extends in the trench, coats the gate region, and contacts the semiconductor Heterostructure.

A part of the trench is delimited laterally by a lateral structure that forms a first step and the semiconductor heterostructure forms a first edge and a second edge of said first step, the first edge being formed by the first semiconductor layer.

At least some embodiments of the present disclosure provide a method for manufacturing a HEMT transistor that includes:

in a semiconductor heterostructure that includes a first semiconductor layer and a second semiconductor layer arranged on top of the first semiconductor layer, forming a trench that extends through the second semiconductor layer and a portion of the first semiconductor layer;

forming a gate region of conductive material within the trench;

within the trench, forming a dielectric region that coats the gate region and contacts the semiconductor heterostructure; and forming a lateral structure that delimits laterally a part of the trench and forms a first step; and wherein the semiconductor heterostructure forms a first edge and a second edge of said first step, the first edge being formed by the first semiconductor layer.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
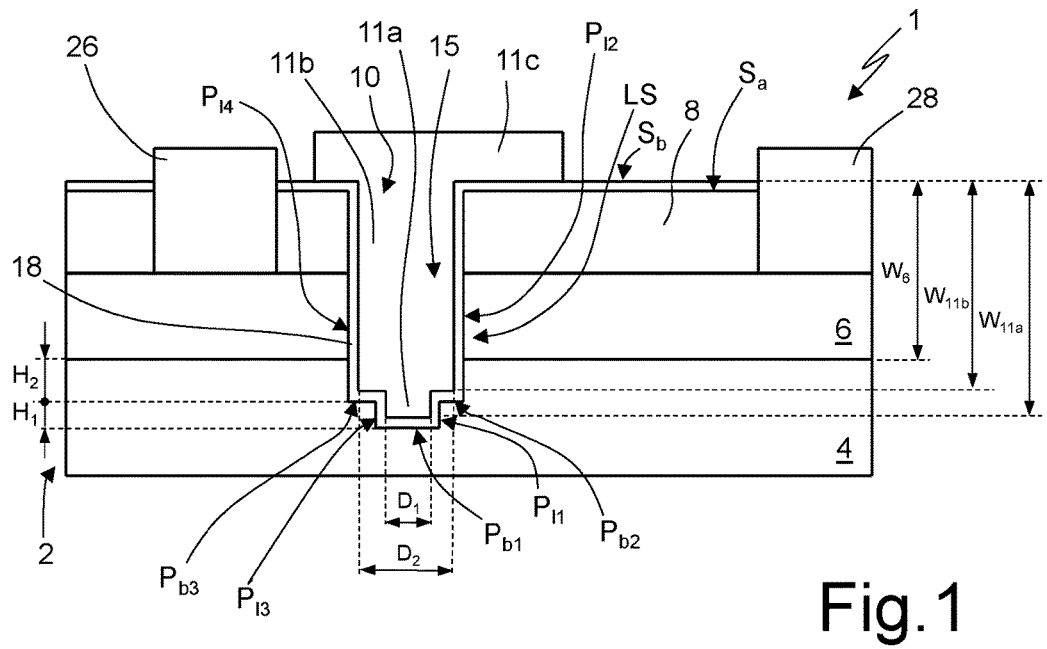
FIG. 1 is a schematic illustration of a cross-section (not in scale) of a portion of the present HEMT transistor.

FIG. 1 shows a first embodiment of the present HEMT transistor, designated by 1.

In detail, the HEMT transistor 1 comprises a semiconductor body 2, which in turn comprises a first layer 4 and a second layer 6, referred to hereinafter as the bottom layer 4 and the top layer 6, respectively.

The bottom layer 4 is of a first semiconductor material, such as for example a first semiconductor alloy of elements of Groups III and V of the Periodic Table; purely by way of example, in what follows it is assumed that the bottom layer 4 is of gallium nitride (GaN).

The top layer 6 overlies the bottom layer 4, with which it is in direct contact, and is of a second semiconductor material, such as for example a second semiconductor alloy of elements of Groups III-V of the Periodic Table, this second semiconductor alloy being different from the first semiconductor alloy. Purely by way of example, in what follows it is assumed that the top layer 6 is of aluminum gallium nitride (AlGaN).

The bottom layer 4 and the top layer 6 are, for example, of an N type. Furthermore, the bottom layer 4 has a thickness of, for example, between 20 nm and 7 µm, while the top layer 6 has a thickness of, for example, between 5 nm and 400 nm.

Although not shown, the semiconductor body 2 further comprises a substrate, made for example of silicon, on which the bottom layer 4 is formed. Since this substrate is irrelevant for the purposes of the present disclosure, it will not be mentioned any further in the present description.

The HEMT transistor 1 further comprises a passivation region 8, which overlies, in direct contact, the top layer 6 and is made, for example, of silicon nitride. For instance, the passivation region 8 has a thickness of 100 nm. The passivation region 8 forms a first surface $S_a$ of the HEMT transistor 1.

The HEMT transistor 1 further comprises a gate region 10, which extends inside a trench 15 and is of conductive material; for example, the gate region 10 may be made up of one or more metal layers, made for example of aluminum, nickel, or tungsten.

In detail, the trench 15 extends through the passivation region 8, starting from the first surface $S_a$, as well as through the top layer 6. Furthermore, the trench 15 traverses a top portion of the bottom layer 4, arranged in contact with the top layer 6.

In greater detail, the trench 15 is delimited by a first side wall $P_{11}$, a second side wall $P_{12}$, a third side wall $P_{13}$, and a fourth side wall $P_{14}$, which are mutually parallel and are perpendicular to the first surface $S_a$. Further, the trench 15 is delimited by a first bottom wall $P_{b1}$, a second bottom wall $P_{b2}$, and a third bottom wall $P_{b3}$, which are parallel to one another and to the first surface $S_a$.

In particular, the first bottom wall $P_{b1}$ extends in the bottom layer 4, to a first depth (measured, for example, with respect to the first surface $S_a$). Also the second bottom wall $P_{b2}$ and the third bottom wall $P_{b3}$ extend in the bottom layer 4, to the same depth, which is less than the aforementioned first depth. Furthermore, the first side wall $P_{11}$ connects the first and second bottom walls $P_{b1}$, $P_{b2}$; the third side wall $P_{13}$ connects, instead, the first and third bottom walls $P_{b1}$, $P_{b3}$. Furthermore, the second side wall $P_{12}$ connects the second bottom wall $P_{b2}$ to the first surface $S_a$; the fourth side wall $P_{14}$ connects the third bottom wall $P_{b3}$ to the first surface $S_a$.

Figure 2:
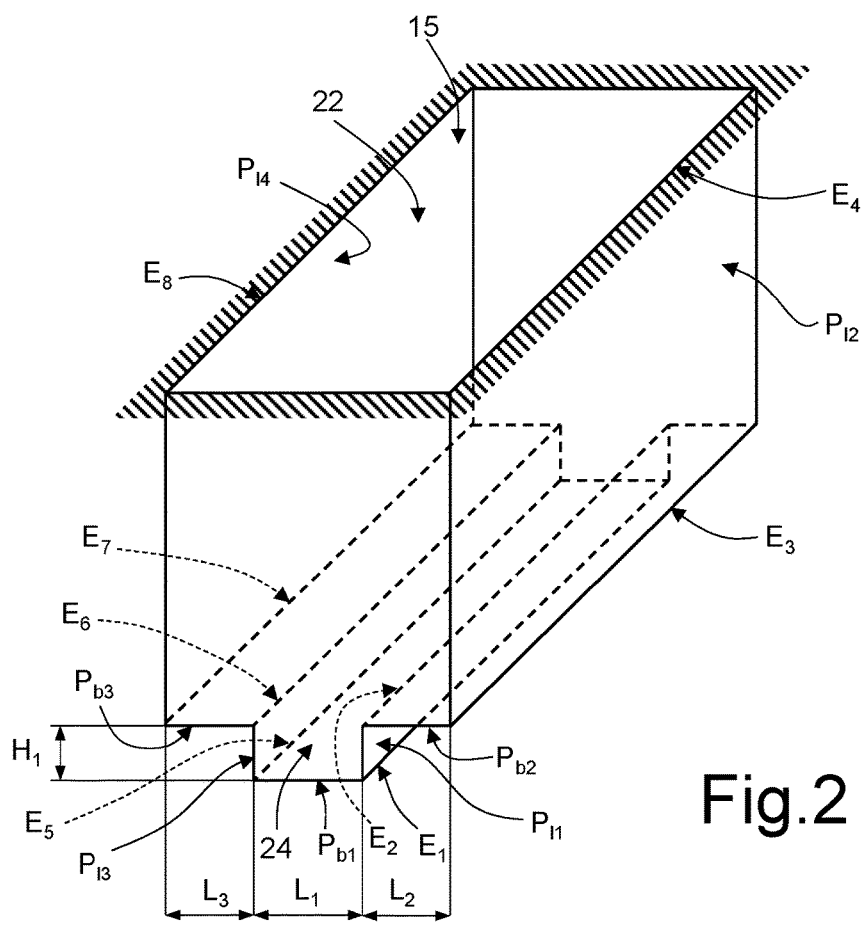
FIG. 2 is a schematic perspective view (not in scale) of a trench of the HEMT transistor shown in FIG. 1.

In practice, as shown in greater detail in FIG. 2, the first bottom wall $P_{b1}$ and the first side wall $P_{11}$ form a first edge $E_1$; further, the first side wall $P_{11}$ and the second bottom wall $P_{b2}$ form a second edge $E_2$, which is parallel to the first edge $E_1$, with which it is coplanar. In addition, the second bottom wall $P_{b2}$ and the second side wall $P_{12}$ form a third edge $E_3$, which is parallel to the second edge $E_2$, with which it is coplanar. In turn, the second side wall $P_{12}$ forms a fourth edge $E_4$ with the first surface $S_a$ (not shown in FIG. 2).

In addition, the first bottom wall $P_{b1}$ and the third side wall $P_{13}$ form a fifth edge $E_5$; further, the third side wall $P_{13}$ and the third bottom wall $P_{b3}$ form a sixth edge $E_6$, which is parallel to the fifth edge $E_5$, with which it is coplanar. In addition, the third bottom wall $P_{b3}$ and the fourth side wall $P_{14}$ form a seventh edge $E_7$, which is parallel to the sixth edge $E_6$, with which it is coplanar. In turn, the fourth side wall $P_{14}$ forms an eighth edge $E_8$ with the first surface $S_a$.

In even greater detail, the first and third side walls $P_{11}$, $P_{13}$ are set apart from one another by a distance equal to $L_1$ (measured in a direction perpendicular to the first and third side walls $P_{11}$, $P_{13}$), which thus represents the width of the first bottom wall $P_{b1}$. The widths of the second and third bottom walls $P_{b2}$, $P_{b3}$ are instead designated, respectively, by $L_2$ and $L_3$. In addition, the first and third side walls $P_{11}$, $P_{13}$ have a height equal to $H_1$, measured in a direction perpendicular to the first bottom wall $P_{11}$. Furthermore, as shown in FIG. 1, each one of the second and fourth side walls $P_{12}$, $P_{14}$ has a respective bottom portion, which extends starting, respectively, from the third and seventh edges $E_3$, $E_7$ until it contacts the top layer 6, this portion having a height $H_2$.

In practice, the trench 15 forms a first cavity 22 and a second cavity 24, communicating with one another and having the same length. The first cavity 22 gives out onto the first surface $S_a$, overlies the second cavity 24 and has a width equal to $L_1+L_2+L_3$; the second cavity 24 has a width equal to $L_1$. Purely by way of example, each of the widths $L_1$, $L_2$ and $L_3$ may be comprised between 0.1 µm and 10 µm; further, the height $H_1$ may, for example, be comprised between 1 nm and 500 nm, whereas the height $H_2$ may, for example, be comprised between 0 and 500 nm.

In other words, the first side wall $P_{11}$ and the second bottom wall $P_{b2}$ form a first step, i.e., a first shoulder, of a lateral structure LS that delimits the trench 15 laterally and extends from a side of the first bottom surface $P_{b1}$. In particular, denoting the ensemble of the semiconductor body 2 and of the passivation region 8 as the main body, the lateral structure LS is formed by the main body. Furthermore, the second bottom wall $P_{b2}$, the second side wall $P_{12}$, and the first surface $S_a$ form a sort of second step of the aforementioned lateral structure LS. The first and second steps are arranged in succession, in such a way that the lateral structure LS assumes a staircase profile.

The HEMT transistor 1 further comprises a dielectric region 18, which is formed, for example, by aluminum nitride (AlN), or silicon nitride (SiN), or silicon oxide (SiO$_2$), and coats the first surface $S_a$. Furthermore, the dielectric region 18 internally coats the trench 15, i.e., coats, among others, the first, second, and third bottom walls $P_{b1}$, $P_{b2}$, $P_{b3}$, as well as the first, second, third, and fourth side walls $P_{11}$, $P_{12}$, $P_{13}$ and $P_{14}$. In this connection, as previously mentioned, the first, second, and third bottom walls $P_{b1}$, $P_{b2}$, $P_{b3}$ are formed by the bottom layer 4, as also the first and third side walls $P_{11}$, $P_{13}$, while each of the second and fourth side walls $P_{12}$, $P_{14}$ is formed by the bottom layer 4, the top layer 6, and the passivation region 8.

In greater detail, the gate region 10 comprises a bottom portion 11a, arranged within the second cavity 24, and a central portion 11b, arranged within the first cavity 22, on the bottom portion 11a, with which it is in direct contact. The dielectric region 18 surrounds the bottom portion 11a and the central portion 11b of the gate region 10, which are thus arranged in the trench 15 more internally than the dielectric region 18 and are coated by the latter. In particular, the dielectric region 18 insulates the bottom portion 11a and the central portion 11b of the gate region 10 from the semiconductor body 2, as well as from the passivation region 8.

In even greater detail, the bottom portion 11a and the central portion 11b of the gate region 10 are both parallelepipedal in shape and have a width $D_1$ and a width $D_2$, respectively, with $D_1 < L_1$ and $D_2 > L_1$. Furthermore, without any loss of generality, the bottom portion 11a extends to a depth $W_{11a}$ (measured starting from the first surface $S_a$), greater than the maximum depth to which the top layer 6 (designated by $W_6$) extends; the central portion 11b extends, instead, to a depth $W_{11b} < W_{11a}$. Without any loss of generality, in the embodiment shown in FIG. 1 we have $W_6 < W_{11}b$.

Figure 3:
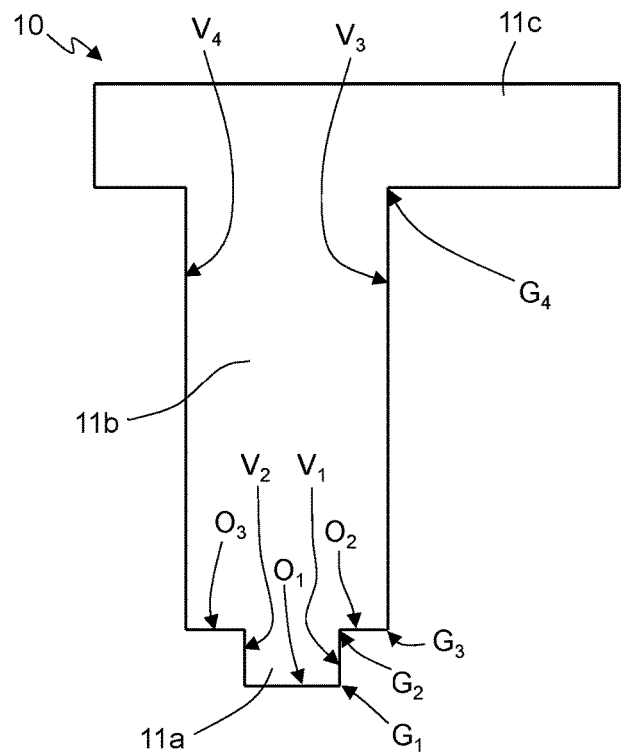
FIG. 3 is a schematic illustration of a cross-section (not in scale) of a portion of the HEMT transistor shown in FIG. 1.

In other words, as shown in greater detail in FIG. 3, the gate region 10 is delimited at the bottom by a first horizontal wall $O_1$, a second horizontal wall $O_2$, and a third horizontal wall $O_3$ and by a first vertical wall $V_1$ and a second vertical wall $V_2$. In particular, the first horizontal wall $O_1$ delimits, at the bottom, the bottom portion 11a of the gate region 10, which is delimited laterally by the first and second vertical walls $V_1$, $V_2$. The central portion 11b of the gate region 10 is delimited, at the bottom (in part), by the second and third horizontal walls $O_2$, $O_3$. The first vertical wall $V_1$ connects the first and second horizontal walls $O_1$, $O_2$, with which it forms a corresponding step of the gate region 10. Likewise, the second vertical wall $V_2$ connects the first and third horizontal walls $O_1$, $O_3$, with which it forms a corresponding step of the gate region 10. Furthermore, the first horizontal wall $O_1$ and the first vertical wall $V_1$ form a first edge $G_1$ of the gate region 10, parallel to the first edge $E_1$ of the trench 15, while the first vertical wall $V_1$ and the second horizontal wall $O_2$ form a second edge $G_2$ of the gate region 10, parallel to the second edge $E_2$ of the trench 15.

As shown again in FIG. 3, the gate region 10 further comprises a top portion 11c, which extends on the central portion 11b, with which it is in direct contact. Furthermore, the central portion 11b of the gate region 10 is delimited laterally by a third vertical wall $V_3$ and a fourth vertical wall $V_4$, which are parallel to one another and face, respectively, the second and fourth side walls $P_{12}$, $P_{14}$ of the trench 15. The third vertical wall $V_3$ forms a third edge $G_3$ and a fourth edge $G_4$ of the gate region 10 with the second horizontal wall $O_2$ and the top portion 11c of the gate region 10, respectively.

In practice, to a first approximation, the dielectric region 18 has an approximately constant thickness inside the trench 15; i.e., it forms a sort of conformal layer that coats the walls of the trench 15; consequently, the part of gate region 10 contained within the trench 15 is delimited by a surface that follows the profile of the trench 15 (and thus of the lateral structure LS). Consequently, corresponding to each edge/step of the trench 15 is an edge/step of the part of gate region 10 contained within the trench 15.

Again with reference to FIG. 1, the portion of dielectric region 18 that extends on the first surface $S_a$ is delimited at the top by a second surface $S_b$, substantially parallel to the first surface $S_a$. Furthermore, the top portion 11c of the gate region 10 has a width greater than $L_1 + L_2 + L_3$ and projects laterally both with respect to the second side wall $P_{12}$ and with respect to the fourth side wall $P_{14}$. Without any loss of generality, in the embodiment shown in FIG. 1, the top portion 11c of the gate region 10 projects laterally from the second side wall $P_{12}$ to a greater extent than the top portion 11c projects from the fourth side wall $P_{14}$.

The HEMT transistor 1 further comprises a source metallization 26 and a drain metallization 28, arranged on sides opposite to the trench 15 and to the top portion 11c of the gate region 10. Each one of the source metallization 26 and the drain metallization 28 traverses the portion of dielectric region 18 arranged on top of the front surface $S_a$ and the portion underlying the passivation region 8 until it contacts the top layer 6. In a per se known manner, each one of the source metallization 26 and the drain metallization 28 may be formed, for example, by a corresponding plurality of metal layers (for example, of titanium, aluminum, and tungsten); further, a top portion of each one of the source metallization 26 and the drain metallization 28 extends up to a height greater than the height of the second surface $S_b$.

In greater detail, the second and fourth side walls $P_{12}$, $P_{14}$ of the trench 15 face the drain metallization 28 and the source metallization 26, respectively.

In use, the gate region 10, the dielectric region 18, and the bottom layer 4 form a MOSFET, the channel of which extends in the bottom layer 4, underneath the first bottom wall $P_{b1}$. This channel, of the normally off type, may be modulated by applying a voltage to the gate region 10.

In a per se known manner, underneath the interface between the bottom layer 4 and the top layer 6, thus in the bottom layer 4, a so-called "two-dimensional electron gas" (2DEG) is formed, which represents the channel (of the normally on type) of the HEMT transistor 1. Also this channel is modulated by the voltage present on the gate region 10, thanks to the presence, in the top portion 11c of the gate region 10, of a projection that extends, with respect to the underlying central portion 11b, towards the drain metallization 28, thus overlying a corresponding portion of the two-dimensional electron gas. In other words, the top layer 6 functions as barrier layer, whereas the bottom layer 4 functions as buffer layer.

Figure 4:
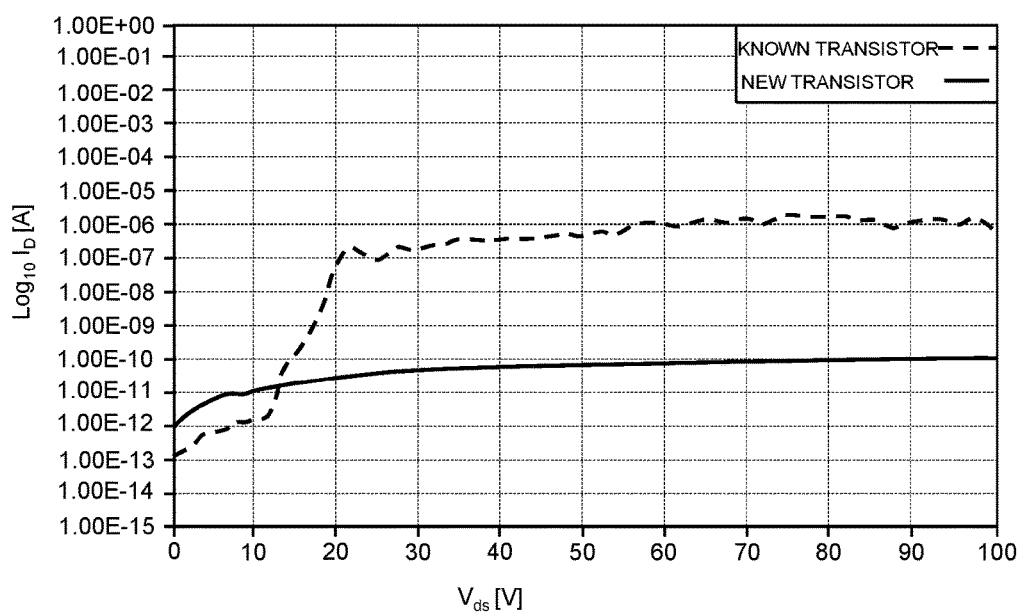
FIG. 4 shows two examples of plots, as a function of the drain-to-source voltage, of the leakage current, for a HEMT transistor of a known type and the present HEMT transistor, respectively.

The HEMT transistor 1 has thus, as a whole, a channel of the normally off type, thanks to the presence of the aforementioned MOSFET. Furthermore, it may be shown that the HEMT transistor 1 exhibits a leakage current of the type illustrated in FIG. 4, where there further appears an example of leakage current of a HEMT transistor of a known type.

Figure 5:
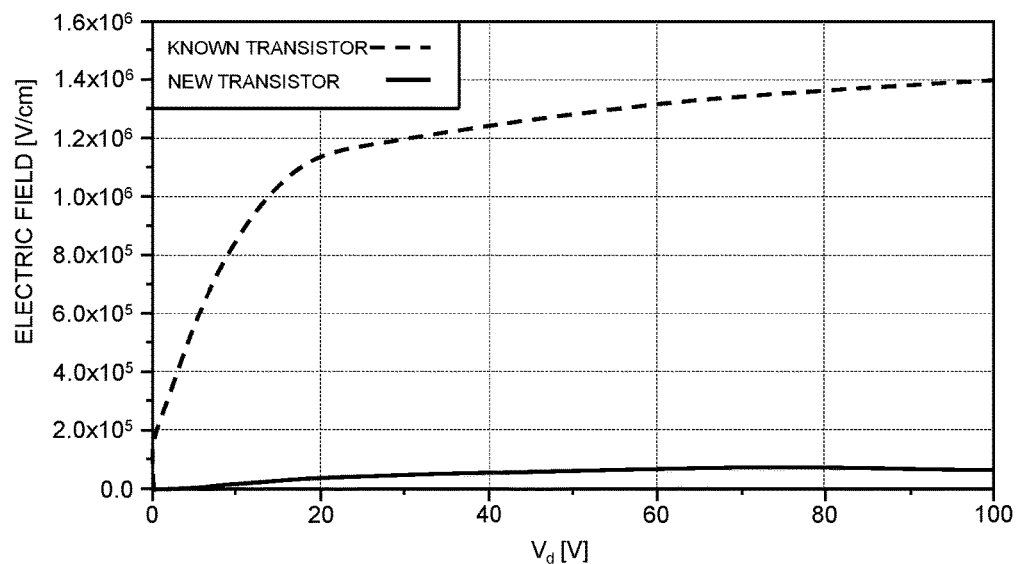
FIG. 5 shows two examples of plots of the electrical field versus the drain voltage, for a HEMT transistor of a known type and for the present HEMT transistor, respectively.

In practice, the HEMT transistor 1 is not affected by the DIBL phenomenon. This is due to the fact that, thanks to the presence of the aforementioned first step of the trench 15, the electrical field at the aforementioned first edge $E_1$ presents a pattern as a function of the drain voltage that is of the type shown in FIG. 5 (on the hypothesis of zero gate and source voltages), which further represents an example of the corresponding plot of the electrical field that arises in a HEMT transistor of a known type and where the gate region is formed in a recess of a traditional shape, at a bottom edge of this recess. In fact, the presence of the aforementioned first step of the lateral structure implies the presence, in the semiconductor body 2, of the third edge $E_3$; consequently, the electrical field is approximately shared between the first and third edges $E_1$, $E_3$.

Figure 6:
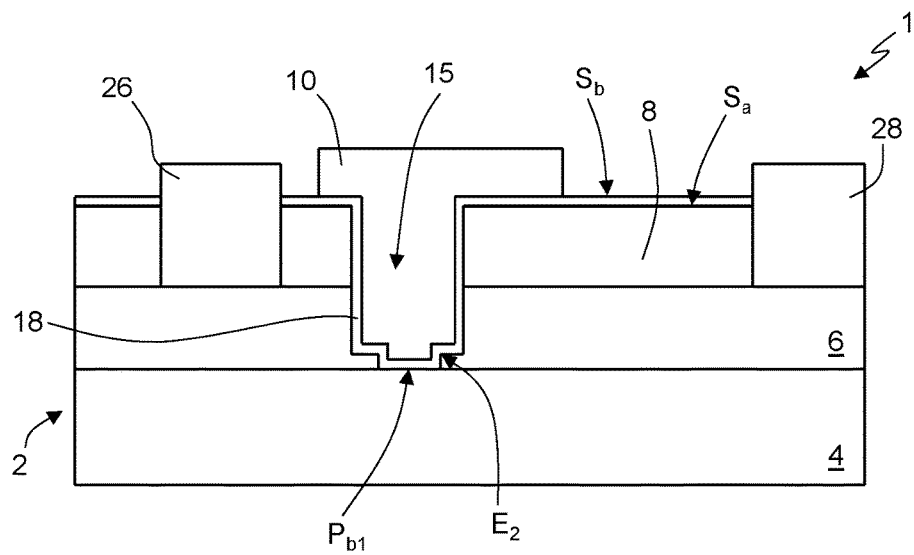
FIGS. 6-8 and 15 are schematic cross-sectional views (not in scale) of further embodiments of the present HEMT transistor.

Further possible are embodiments of the type shown in FIG. 1, but where the trench 15 extends to depths different from what has been described previously. For instance, as shown in FIG. 6, it is possible for the first bottom wall $P_{b1}$ of the trench 15 to lie in the plane of the interface between the bottom layer 4 and the top layer 6. In this case, the gate region 10 is entirely on top of the bottom layer 4. Consequently, the second edge $E_2$ of the trench 15 and the aforementioned first step of the trench 15 are formed by the top layer 6. The first edge $E_1$ is instead still in contact with the bottom layer 4, and thus guarantees the aforementioned reduction of the electrical field.

Figure 7:
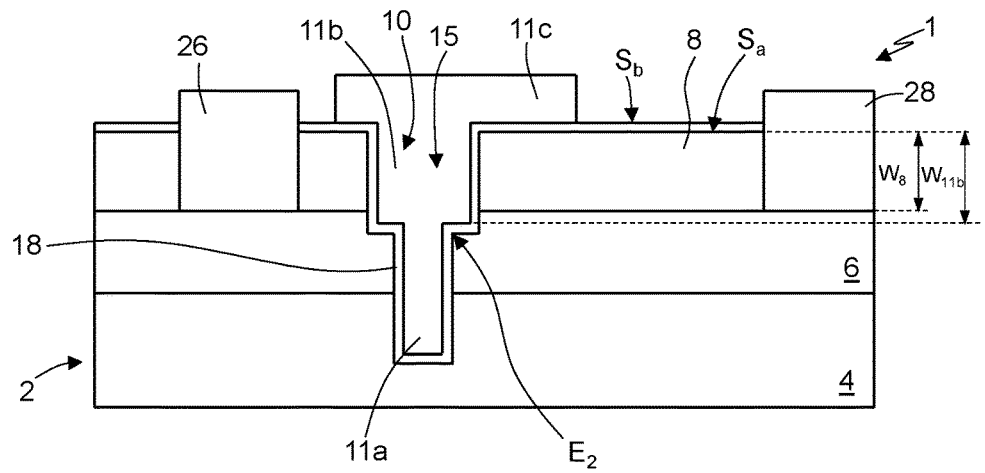

According to a different embodiment, shown in FIG. 7, the HEMT transistor 1 is of the same type as the one shown in FIG. 1, apart from the fact that the second edge $E_2$ of the trench 15 is formed by the top layer 6. Without any loss of generality, assuming that the passivation region 8 extends to a depth $W_8$, we have $W_{11}b > W_8$ even though variations where we have $W_{11}b = W_8$ are in any case possible.

In general, the embodiments shown in FIGS. 6 and 7 are characterized by low resistances between the source metallization 26 and drain metallization 28, since in both cases a part of the channel of the MOSFET is formed in the top layer 6; the consequent greater extension of the two-dimensional gas thus entails a reduction of the so-called $R_{ON}$.

Figure 8:
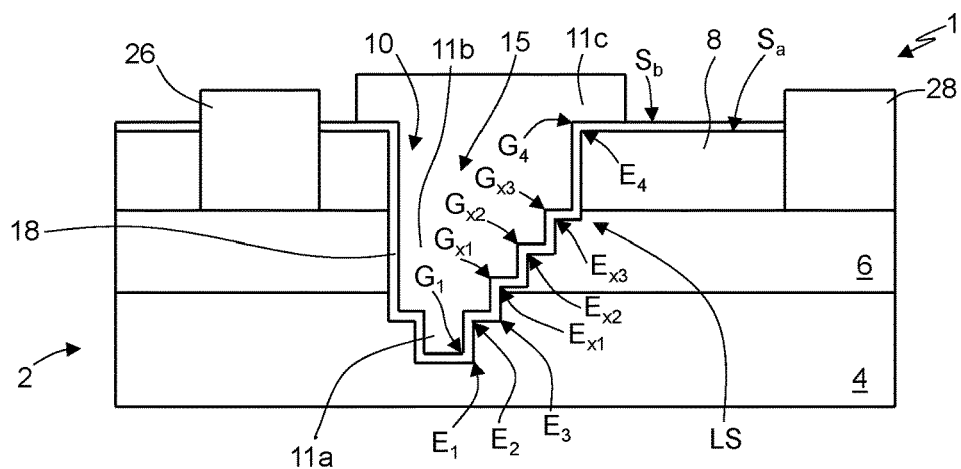

FIG. 8 shows, instead, a further embodiment in which the lateral structure LS comprises more than two steps. For instance, without any loss of generality, in the embodiment shown in FIG. 8 the lateral structure LS forms, in addition to the aforementioned first and second steps (the upper edges of which $E_2$, $E_4$ are shown in FIG. 8), a further three steps, the upper edges of which are designated by $E_{x1}$, $E_{x2}$, and $E_{x3}$, respectively. Purely by way of example, the edges $E_{x1}$, $E_{x2}$, and $E_{x3}$ are formed by the top layer 6. The central portion 11 of the gate region 10 thus forms another three corresponding additional steps, the upper edges of which are designated by $G_{x1}$, $G_{x2}$ and $G_{x3}$, respectively; without any loss of generality, in FIG. 8 the edge $G_{x3}$ is set coplanar with the interface between the bottom layer 4 and the top layer 6.

It may be shown that, as the number of steps of the lateral structure LS increases, the electrical field present between the gate region 10 and the drain metallization 28 is distributed more evenly along the lateral structure LS since the corresponding peaks, located in the presence of the edges, reduce their own amplitude. In this way, any deterioration of the HEMT transistor during the turning off steps, in which the transistor is subjected to high drain voltages, is prevented.

The present HEMT transistor 1 may be produced, for example, by implementing the manufacturing method described in what follows. Without any loss of generality and purely by way of non-limiting example, the manufacturing method is described with reference to production of the HEMT transistor 1 shown in FIG. 1.

Figure 9:
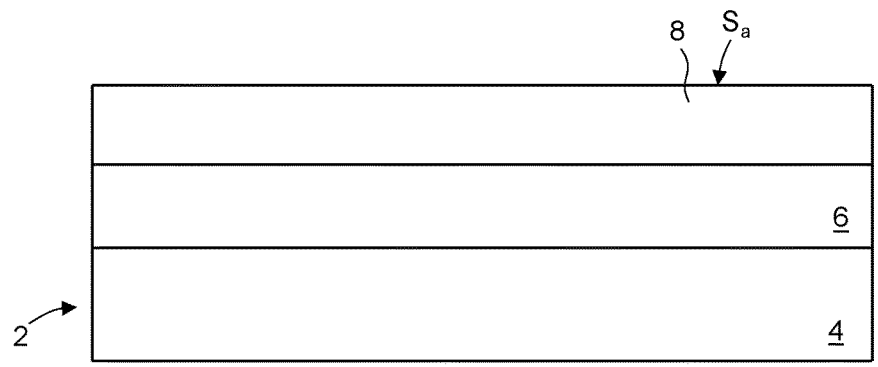
FIGS. 9-14 are schematic cross-sectional views (not in scale) of the HEMT transistor illustrated in FIG. 1, during successive steps of a manufacturing method.

Initially, as shown in FIG. 9, the main body, including the semiconductor body 2 and the passivation region 8, is provided in a per se known manner.

Figure 10:
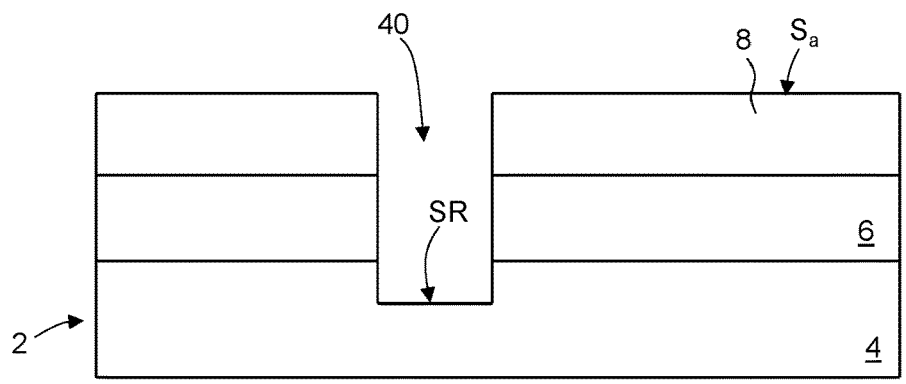

Next, as shown in FIG. 10, in a per se known manner, a photolithographic process and a subsequent etching process are carried out in order to remove selectively a portion of the passivation region 8, an underlying portion of the top layer 6, and an underlying portion of the bottom layer 4 for forming a first recess 40, which has the shape of a parallelepiped and has a depth greater than the aforementioned depth $W_{11b}$. The first recess 40 is delimited, at the bottom, by a plane surface SR, formed by the bottom layer 4, and is designed to house the central portion 11b of the gate region 10 and the portion of dielectric region 18 that coats it.

Figure 11:
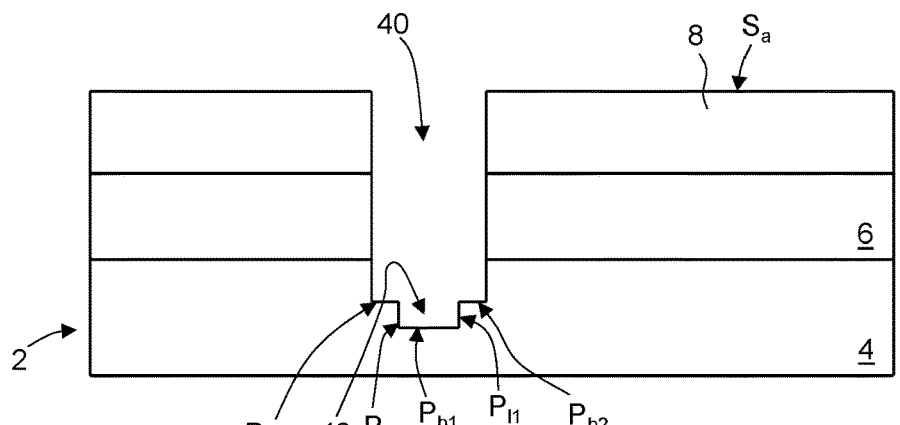

Next, as shown in FIG. 11, in a per se known manner a further photolithographic process and a subsequent further etching process are carried out in order to remove selectively a portion of the bottom layer 4, starting from the plane surface SR. In particular, a portion of the bottom layer 4 that forms a central portion of the plane surface SR is removed, said central portion separating a pair of lateral portions of the plane surface SR, which in turn form the second and third bottom walls $P_{b2}$, $P_{b3}$, respectively, of the trench 15. In this way, a second recess 42 is formed, which is delimited at the bottom by the first bottom wall $P_{b1}$ and has a smaller width than the first recess 40. The second recess 42 is further delimited laterally by the first and third side walls $P_{11}$, $P_{13}$ and is designed to house the bottom portion 11a of the gate region 10, and thus extends to a depth greater than the aforementioned depth $W_{11a}$. The first and second recesses 40, 42 form the trench 15.

Figure 12:
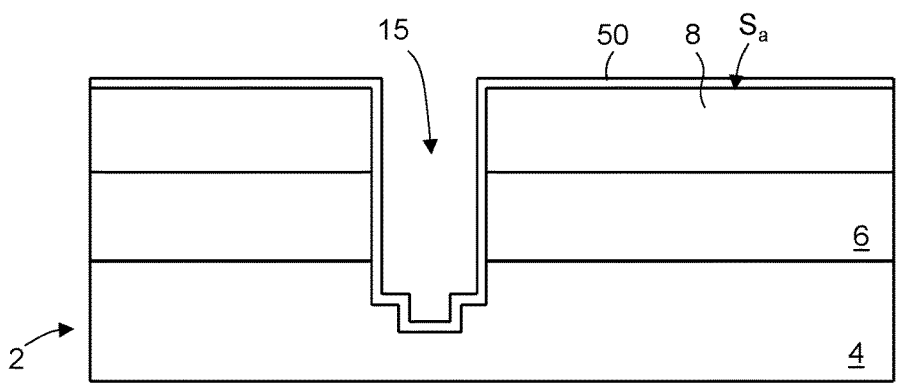

Next, as shown in FIG. 12, formed on the first surface $S_a$ and within the trench 15 is a dielectric layer 50, made, for example, of aluminum nitride or silicon nitride. The dielectric layer 50 thus coats the walls of the trench 15 and is formed, for example, by deposition.

Figure 13:
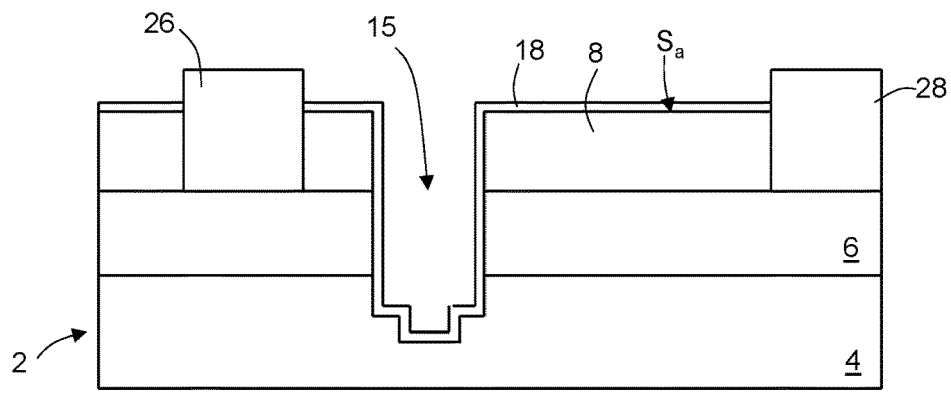

Next, as shown in FIG. 13, the source metallization 26 and the drain metallization 28 are formed in a per se known manner. For this purpose, even though not shown in detail, it is possible to carry out a further photolithographic process and a subsequent etching process for removing selectively portions of the dielectric layer 50 and underlying portions of the passivation region 8, to form cavities designed to house, respectively, the source metallization 26 and the drain metallization 28, which are subsequently formed within these cavities by the so-called "lift-off" technique. According to the lift-off technique, by photolithography a resist mask is formed, which leaves exposed just the regions of the HEMT transistor 1 that are to be overlaid by the source metallization 26 and by the drain metallization 28. Next, metal material is deposited on the HEMT transistor 1; subsequent removal of the resist mask also entails removal of the metal material overlying the resist mask itself. Once the source metallization 26 and the drain metallization 28 are formed, what remains of the dielectric layer 50 forms the dielectric region 18.

Next, even though not shown, a thermal process is carried out, for example at a temperature comprised between 500° C. and 900° C. for formation of the contacts.

Figure 14:
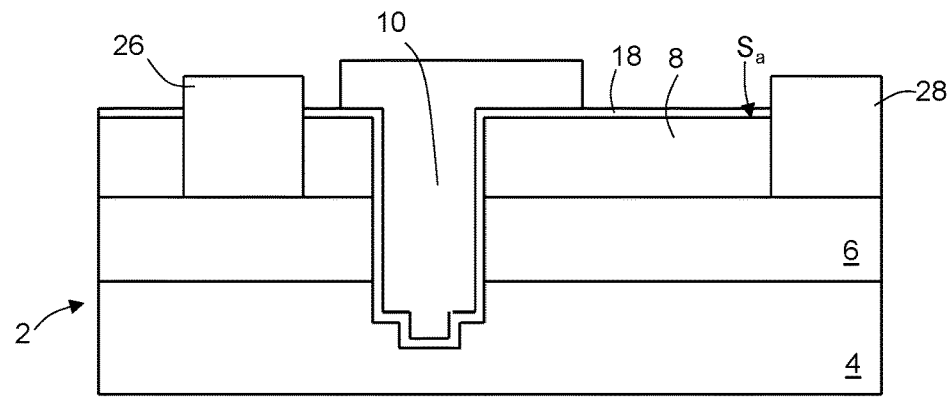

Next, as shown in FIG. 14, the gate region 10 is formed, the bottom and central portions 11a, 11b of which extend within the trench 15. Also the gate region 10 may be formed by a corresponding lift-off process, which envisages forming a corresponding resist mask, depositing conductive material both on the mask and on the portion of HEMT transistor 1 left free from the mask, and subsequently removing the resist mask and the conductive material arranged on top of it.

As regards, instead, embodiments of the type shown in FIG. 8, i.e., embodiments in which the lateral structure LS forms more than two steps, they may be formed for example by carrying out the steps (not shown) of:

a) removing selectively a top portion of the main body for removing a corresponding recess, delimited by a bottom surface;

b) starting from the aforementioned bottom surface, removing selectively an underlying portion of main body for forming a further recess, delimited by a respective bottom surface, the further recess having a width smaller than the previous recess and being laterally staggered with respect to the side walls of the previous recess; and c) iterating step b) until formation of the desired number of steps.

In the case where the manufacturing method just described above is adopted, the shape of the trench 15 may differ from what is shown in FIG. 8; in particular, the portion of trench 15 facing the source metallization 26 may include a number of steps equal to that of the lateral structure LS.

From what has been described and illustrated previously, the advantages that the present solution affords emerge clearly.

In particular, the present HEMT transistor is substantially immune from the DIBL phenomenon since, in use, the electrical field at the first edge $E_1$ (in contact with the first layer 4) is reduced, thanks to the presence in the semiconductor body 2 of at least the third edge $E_3$.

In conclusion, it is clear that modifications and variations may be made to what has been described and illustrated so far, without thereby departing from the scope of the present disclosure.

For instance, each one of the source metallization 26 and the drain metallization 28 may penetrate in part within the top layer 6, as well as possibly also in a top portion of the bottom layer 4.

The bottom layer 4 may include a respective top portion and a respective bottom portion (not shown), which are doped for example with carbon atoms; in this case, the top portion is doped with carbon atoms to an extent smaller than the bottom portion and functions as so-called channel layer, whereas the bottom portion of the bottom layer 4 functions as buffer layer. In this case, if the second and third bottom walls $P_{b2}$, $P_{b3}$ are formed by the bottom layer 4, they may be formed indifferently by the top portion or by the bottom portion of the bottom layer 4.

Doping of the semiconductor body 2 may be of a type different from what has been described. For instance, the bottom layer 4 and the top layer 6 may be of a P type.

As regards the trench 15, the portion of trench 15 arranged between the first bottom wall $P_{b1}$ and the source metallization 26 may have a shape different from what has been described. For instance, embodiments are possible of the type shown in FIG. 1 but where the third bottom wall $P_{b3}$ is absent, in which case the third and fourth side walls $P_{l3}$, $P_{l4}$ are replaced by a single side wall. In this connection, it may be noted how, for the purposes of prevention of the DIBL phenomenon, the shape of the further lateral structure that delimits the trench 15 laterally and is opposite to the lateral structure LS is to a first approximation irrelevant since the electrical field between the source metallization 26 and the gate region 10 is less intense than the electrical field present between the gate region 10 and the drain metallization 28.

The passivation region 18 may be absent, in which case the first surface $S_a$ is formed by the top layer 6.

Figure 15:
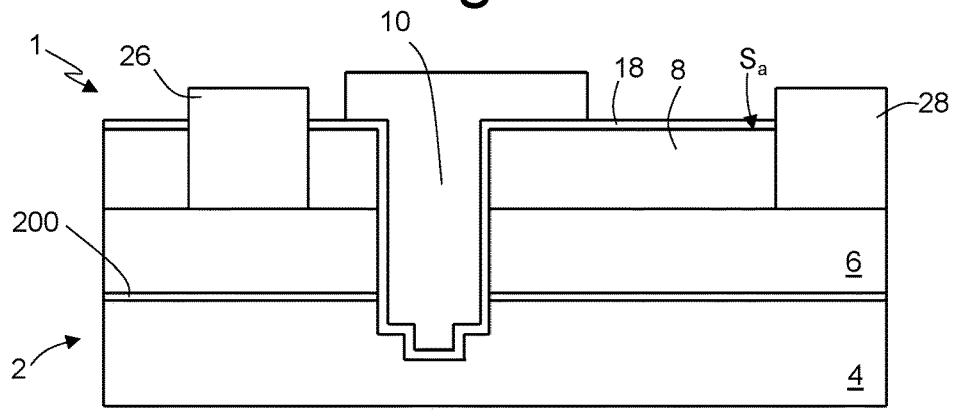

Again, as shown in FIG. 15, between the bottom layer 4 and the top layer 6 there may be present a spacer layer 200, made, for example, of aluminum nitride and having a smaller thickness, for example of 1 nm; the spacer layer 200 has the purpose of improving the mobility of the two-dimensional electron gas. In general, there are thus possible further embodiments that correspond to embodiments described previously but further include the spacer layer 200. In these further embodiments, the spatial distribution of the steps and of the edges of the lateral structure LS may, for example, correspond to that of the corresponding embodiments described previously in the sense that, if in a previous embodiment an edge of a step is formed by a given layer (for example, the bottom layer 4 or the top layer 6), in the corresponding further embodiment the corresponding edge is again formed by that given layer.

Once again with reference to the lateral structure LS, even though previously orthogonal steps have been described, i.e., steps that connect pairs of horizontal surfaces by vertical surfaces, it is, however, possible for the vertical surfaces of one or more steps to be transverse with respect to the corresponding horizontal surfaces and/or for one or both of the horizontal surfaces of one or more steps to be replaced by surfaces that are not parallel to the first surface $S_a$. In other words, in general the walls and the vertical surfaces may be not perfectly orthogonal to the first surface $S_a$.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A normally off heterostructure field-effect transistor (HEMT), comprising:
    a semiconductor heterostructure including a first semiconductor layer and a second semiconductor layer, the second semiconductor layer being arranged on top of the first semiconductor layer;
    an insulator on the second semiconductor layer;
    a trench which extends through the insulator, the second semiconductor layer, and a portion of the first semiconductor layer;
    a gate region of conductive material, which extends in the trench; and
    a dielectric region which extends in the trench, coats the gate region, and contacts the semiconductor heterostructure, the dielectric region including an upper portion extending on the insulator and the insulator being positioned between a bottom surface of the upper portion of the dielectric region and a top surface of the second semiconductor layer; wherein:
        a part of the trench is delimited laterally by a lateral structure that forms a first step and a second step,
        the first semiconductor layer forms a bottom wall of the trench, and first and second walls of said first step,
        the first wall extends upwardly from the bottom wall and the second wall extends outwardly from the first wall,
        the second semiconductor layer forms a third wall and a fourth wall of said second step,
        the dielectric region coats the bottom wall, the first and second walls of the first step, and the third and fourth walls of the second step, and
        the gate region is on the first step and the second step.

2. The HEMT according to claim 1, further comprising a first electrode region and a second electrode region, the trench being arranged between the first and second electrode regions; and wherein the lateral structure is formed by a part of the semiconductor heterostructure arranged between the trench and one of said first and second electrode regions.

3. The HEMT according to claim 1, wherein the lateral structure has staircase shape.

4. The HEMT according to claim 3, wherein the lateral structure further forms a third step, which forms a fifth wall and a sixth wall, the fifth wall being formed by the semiconductor heterostructure, the sixth wall overlying the fifth wall.

5. The HEMT according to claim 4, wherein the sixth wall is formed, in part, by the semiconductor heterostructure.

6. The HEMT according to claim 1, wherein the gate region comprises a first portion which is arranged in the trench and includes, on a first side of the first portion, a surface that forms a step of the gate region, said step of the gate region being surrounded by, and physically separated from, the semiconductor heterostructure.

7. The HEMT according to claim 6, wherein the gate region further comprises a second portion which extends on the first portion and projects laterally from the trench.

8. The HEMT according to claim 1, wherein the lateral structure includes a third step positioned between the first step and the second step, the third step including a fifth wall extending from the second wall of the first step and a sixth wall extending from the fifth wall to the third wall of the second step.

9. The HEMT according to claim 1, wherein the first and second semiconductor layers are of two materials that are configured to generate a two-dimensional electron gas in the first semiconductor layer.

10. The HEMT according to claim 1, wherein the first and second semiconductor layers are formed, respectively, by gallium nitride and aluminum gallium nitride.

11. The HEMT according to claim 1, wherein the insulator is SiN.

12. A normally off heterostructure field-effect transistor (HEMT), comprising:
a semiconductor heterostructure including a first semiconductor layer and a second semiconductor layer, the second semiconductor layer being arranged on top of the first semiconductor layer;
a passivation layer on the second semiconductor layer;
a conductive gate region extending in the passivation layer and the semiconductor heterostructure; and
a dielectric region coating the gate region and contacting the semiconductor heterostructure and the passivation region;
wherein the semiconductor heterostructure includes a lateral structure that forms a first step and a second step, the first step including a first wall and a second wall, the second wall being parallel to an interface between the first semiconductor layer and the second semiconductor layer, the first wall being transverse to the second wall, the first and second walls being formed by the first semiconductor layer, the second step including a third wall and a fourth wall, the fourth wall being parallel to the second wall, the third wall being parallel to the first wall, the third and fourth walls being formed by the second semiconductor layer, wherein the lateral structure forms a third step including a fifth wall and a sixth wall, the sixth wall is parallel to the second wall, the fifth wall parallel to the first wall, the sixth wall is formed by the second semiconductor layer and the fifth wall is formed by the first semiconductor layer and the second semiconductor layer, and the third step is between the first step and the second step.

13. The HEMT according to claim 12, further comprising a first electrode region and a second electrode region, a trench being arranged between the first and second electrode regions; and wherein the lateral structure is formed by a part of the semiconductor heterostructure arranged between the trench and one of said first and second electrode regions.

14. The HEMT according to claim 12, wherein the gate region comprises a first portion which is arranged in the trench and includes, on a first side of the first portion, a surface that forms a step of the gate region, said step of the gate region being surrounded by, and physically separated from, the semiconductor heterostructure.

15. The HEMT according to claim 14, wherein the gate region further comprises a second portion which extends on the first portion and projects laterally from the trench.

16. The HEMT according to claim 12, wherein the trench has a bottom delimited by a wall of the first semiconductor layer, said wall of the first semiconductor layer forming said first wall of the lateral structure; and wherein the dielectric region coats said wall of the first semiconductor layer.

17. The HEMT according to claim 12, wherein the first and second semiconductor layers are of two materials that are configured to generate a two-dimensional electron gas in the first semiconductor layer.

18. The HEMT according to claim 12, wherein the first and second semiconductor layers are formed, respectively, by gallium nitride and aluminum gallium nitride.

19. The HEMT according to claim 12, wherein the passivation layer is SiN.

20. A normally off heterostructure field-effect transistor (HEMT), comprising:
a semiconductor heterostructure including a first semiconductor layer and a second semiconductor layer, the second semiconductor layer being arranged on top of the first semiconductor layer, a trench extending in the first semiconductor layer and the second semiconductor layer;
a passivation region on the second semiconductor layer;
a conductive gate region extending in the trench through the passivation region and the semiconductor heterostructure; and
a dielectric region coating the gate region and contacting the semiconductor heterostructure and the passivation region, wherein:
the semiconductor heterostructure includes a stepped structure on a first side of the trench and a planar structure on a second side of the trench opposite the first side, the planar structure having a wall that extends from the first semiconductor layer to the passivation region though the second semiconductor layer, the wall of the planar structure having a first height, the stepped structure having a first step that includes a first wall formed by the first semiconductor layer, the first wall being parallel to the wall of the planar structure and having a second height; and
the stepped structure has a second step that includes a second wall formed by the second semiconductor layer, the second wall being parallel to the wall of the planar structure and having a third height, the first height being greater than a sum of the second height and the third height.

21. The HEMT according to claim 20, wherein the stepped structure includes a third step including a third wall formed by the first semiconductor layer and the second semiconductor layer, the third wall being parallel to the wall of the planar structure and having a fourth height, the first height being greater than a sum of the second height, the third height, and the fourth height, the third step being positioned between the first step and the second step.

22. The HEMT according to claim 20, wherein the trench has a first width measured in a first direction from the first side of the trench to the second side of the trench at the passivation region, the first step has a second width measured in a second direction parallel to the first direction, the second step has a third width measured in a third direction parallel to the first direction, and a sum of the second width and the third width is less than the first height.

23. The HEMT according to claim 20, wherein the semiconductor heterostructure includes a third step on the second side of the trench, the third step being positioned between a bottom wall of the trench and the planar structure.

* * * * *